(12) United States Patent
Ahn et al.

(10) Patent No.: US 10,064,280 B2
(45) Date of Patent: Aug. 28, 2018

(54) PRINTED CIRCUIT BOARD

(71) Applicant: LG INNOTEK CO., LTD., Seoul (KR)

(72) Inventors: Jae Hyun Ahn, Seoul (KR); Min Wook Yu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/328,190

(22) PCT Filed: Jul. 24, 2015

(86) PCT No.: PCT/KR2015/007732
§ 371 (c)(1),
(2) Date: Jan. 23, 2017

(87) PCT Pub. No.: WO2016/013904
PCT Pub. Date: Jan. 28, 2016

(65) Prior Publication Data
US 2017/0208692 A1 Jul. 20, 2017

(30) Foreign Application Priority Data

Jul. 25, 2014 (KR) .................. 10-2014-0094789
Sep. 11, 2014 (KR) .................. 10-2014-0120424

(51) Int. Cl.
*H05K 1/18* (2006.01)
*H05K 1/11* (2006.01)
*H05K 1/02* (2006.01)

(52) U.S. Cl.
CPC ........... *H05K 1/184* (2013.01); *H05K 1/0206* (2013.01); *H05K 1/115* (2013.01); *H05K 2201/10151* (2013.01)

(58) Field of Classification Search
CPC .................. H05K 1/184; H01L 27/30
USPC .......................................... 361/760
See application file for complete search history.

(56) References Cited

U.S. PATENT DOCUMENTS

| 6,750,521 B1* | 6/2004 | Chilcott | B81B 7/007 257/414 |
| 8,351,219 B2* | 1/2013 | Lin | H01L 27/14618 257/432 |
| 2008/0055863 A1 | 3/2008 | Cho et al. | |
| 2013/0333930 A1* | 12/2013 | Koyanagi | H05K 1/184 174/258 |
| 2016/0273720 A1* | 9/2016 | Livesay | H01L 33/641 |

FOREIGN PATENT DOCUMENTS

| JP | 2009-224522 A | 10/2009 | |
| KR | 10-0796522 B1 | 1/2008 | |
| KR | 10-2009-0102350 A | 9/2009 | |
| KR | 10-2011-0048202 A | 5/2011 | |
| KR | 10-2012-0130993 | * 12/2012 | .............. H05K 1/18 |
| KR | 10-2012-0130993 A | 12/2012 | |

OTHER PUBLICATIONS

Search Report for International Application No. PCT/KR2015/007732.

* cited by examiner

*Primary Examiner* — Hoa C Nguyen
*Assistant Examiner* — Stanley Tso
(74) *Attorney, Agent, or Firm* — LRK Patent Law Firm

(57) ABSTRACT

A printed circuit board includes an insulating layer and an element embedded in the insulating layer and exposed through a surface of the insulating layer.

7 Claims, 18 Drawing Sheets

PRINTED CIRCUIT BOARD

CROSS-REFERENCE TO RELATED APPLICATIONS

This application is a U.S. National Stage entry from International Application No. PCT/KR2015/007732, filed Jul. 24, 2015, which claims priority to Korean Patent Application Nos. 10-2014-0094789, filed Jul. 25, 2014, and 10-2014-0120424, filed Sep. 11, 2014, the disclosure of which is incorporated by reference herein in its entirety.

BACKGROUND OF THE INVENTION

1. Technical Field

Embodiments relate to a printed circuit board.

2. Description of Related Art

A printed circuit board (PCB) refers to a board on which a circuit is printed on an electrical insulating substrate using conductive materials.

A PCB is configured in a structure in which various types of elements are fixed by determining locations where the elements are mounted in order to densely mount the elements on a flat plate and printing a circuit pattern for connecting the elements on a surface of the flat plate or in a structure in which elements are embedded in the PCB.

Recently, in order to scale down electrical parts and implement multiple functions, a multilayer structure in which PCBs are mounted with high density is being used.

In general, if a PCB has a plurality of insulating substrates including a plurality of insulating layers, a circuit pattern embedded in the PCB is connected to a circuit pattern formed on an outer surface of the PCB through a via.

However, since such a PCB has a structure in which elements are embedded, if a packaged light emitting element is embedded, an empty space occurs between the light emitting element and the PCB. Due to the empty space, luminous efficacy is deteriorated and heat generated by the light emitting element cannot be easily dissipated.

In addition, a conventional PCB has a plurality of layers and thus has a large thickness. Since an element is provided on an internal layer among the plurality of layers, a process of removing external layers is further required to expose a sensing unit of the element and dissipation of heat generated by the element is difficult.

SUMMARY OF THE INVENTION

An object of the present invention devised to solve the problem is to more efficiently emit light from a light emitting unit to improve luminous efficacy by embedding a light emitting element in an insulating layer, exposing the light emitting unit and forming a sealing part such that an empty space does not occur among the sealing part, the insulating layer and the light emitting unit.

In addition, an object of the present invention is to more efficiently diffuse light emitted from the light emitting unit by increasing the width of an opening located at an exposed surface side to be greater than that of the opening located at the light emitting unit side.

According to one embodiment of the present invention, a printed circuit board (PCB) includes an insulating layer including an opening, a light emitting element including a light emitting unit exposed by the opening and embedded in the insulating layer, a sealing part formed of a fluorescent material and filling the opening, and a via formed on a surface opposite to a surface of the insulating layer, on which the light emitting unit of the light emitting element is formed, to be connected to a terminal of the light emitting element.

According to another embodiment of the present invention, a printed circuit board (PCB) includes an insulating layer and a sensing element embedded in the insulating layer and having a sensing unit exposed through one surface of the insulating layer, and a surface of the sensing element, through which the sensing unit is exposed, is coplanar with a surface of the insulating layer.

Advantageous Effects

According to an embodiment of the present invention, since a light emitting element is embedded in an insulating layer and is exposed and a sealing part is formed such that an empty space does not occur among the sealing part, the insulating layer and the light emitting unit, it is possible to more efficiently emit light from a light emitting unit to improve luminous efficacy.

In addition, according to an embodiment of the present invention, since the width of an opening located at an exposed surface side is greater than that of the opening located at a light emitting unit side, it is possible to more efficiently diffuse light emitted from the light emitting unit.

In addition, according to an embodiment of the present invention, since the width of a via located at an exposed surface side to be connected to a terminal of a light emitting element is greater than that of the via located at the terminal side or a heat radiation hole is formed in the via, it is possible to improve heat radiation performance.

In addition, according to an embodiment of the present invention, since a sensing element is mounted in an insulating layer and is exposed through one surface of the insulating layer and the exposed surface of the sensing element is coplanar with the surface of the insulating layer, a process of exposing the sensing unit of the sensing element is unnecessary. Therefore, it is possible to reduce manufacturing costs.

In addition, according to an embodiment of the present invention, it is possible to reduce the thickness of the PCB and to efficiently radiate heat generated by the sensing element.

DETAILED DESCRIPTION OF THE INVENTION

Figure 1:
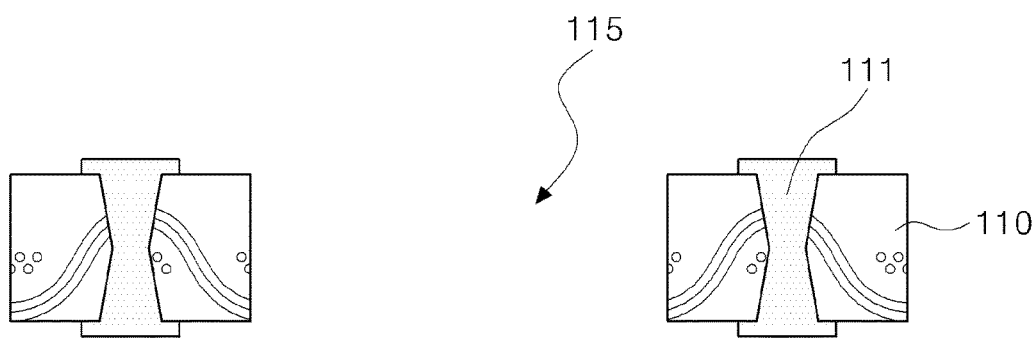
FIGS. 1 to 12 are diagrams illustrating a printed circuit board and a method of manufacturing the same according to an embodiment of the present invention.

Hereinafter, embodiments of the present invention will be described with reference to the accompanying drawings. In describing the present invention, if it is determined that the detailed description of a related known function or construction renders the scope of the present invention unnecessarily ambiguous, the detailed description thereof will be omitted. In the drawings, the shapes and sizes of elements may be exaggerated for clarity and may be different from the actual shapes and sizes of the elements.

FIGS. 1 to 12 are diagrams illustrating a printed circuit board (PCB) and a method of manufacturing the same according to an embodiment of the present invention.

First, the method of manufacturing the PCB according to the embodiment of the present invention will be described with reference to FIGS. 1 to 12.

As shown in FIG. 1, a cavity 115 is formed in a core insulating substrate 110.

The core insulating substrate 110 is a prepreg including glass fiber and resin.

In addition, a via 111 formed of a conductive material may be formed in the core insulating substrate 10.

Figure 2:
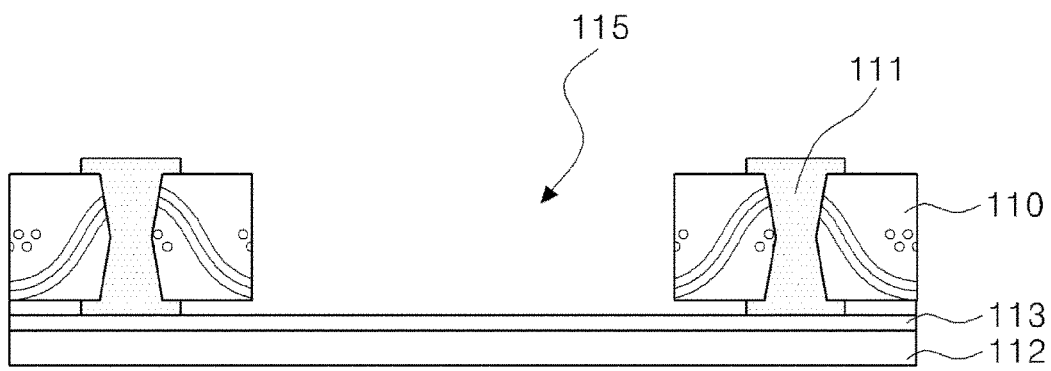
Figure 3:
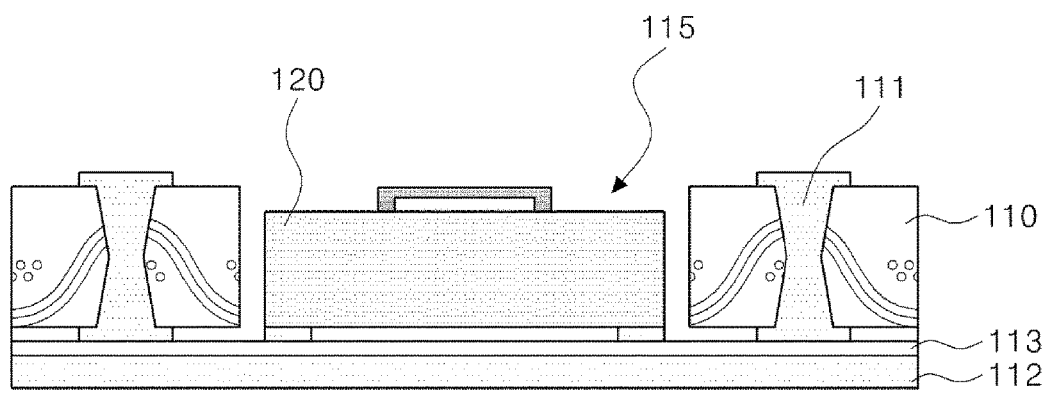

Thereafter, a support substrate 112 with an adhesive film 113 formed thereon is formed on one surface of the core insulating substrate 110 as shown in FIG. 2 and a light emitting element 120 is formed on the adhesive film 113 on the support substrate 112 in the cavity 115 as shown in FIG. 3.

Figure 4:
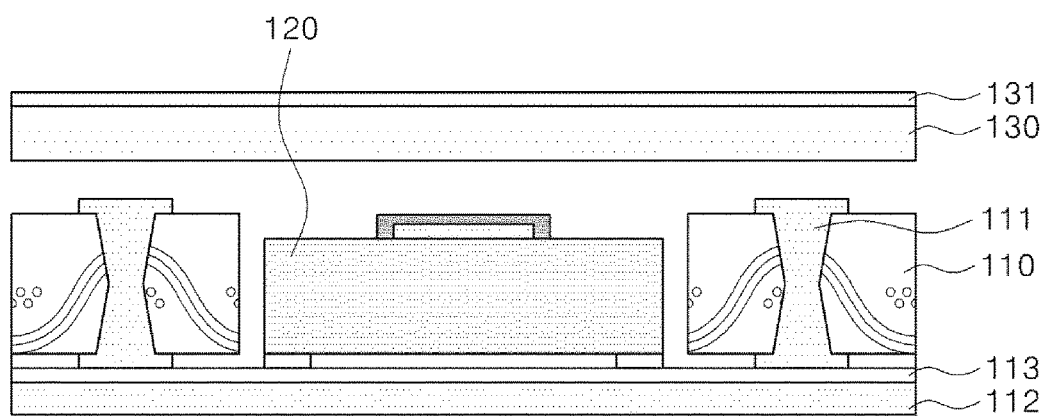

Thereafter, as shown in FIG. 4, an outer insulating layer 130 may be provided on the core insulating substrate 110 and the light emitting element 120 and a metal layer 131 may be further formed on the outer insulating layer 130.

Figure 5:
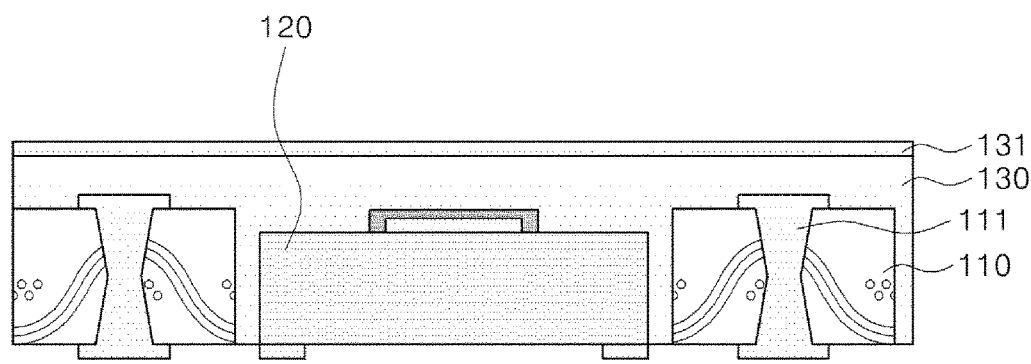

As shown in FIG. 5, some of a material formed as the outer insulating layer 130 may fill a space between the core insulating substrate 110 and the light emitting element 120 to prevent an empty space from being formed between the core insulating substrate 110 and the light emitting element 120, thereby stably fixing the light emitting element 120.

Figure 6:
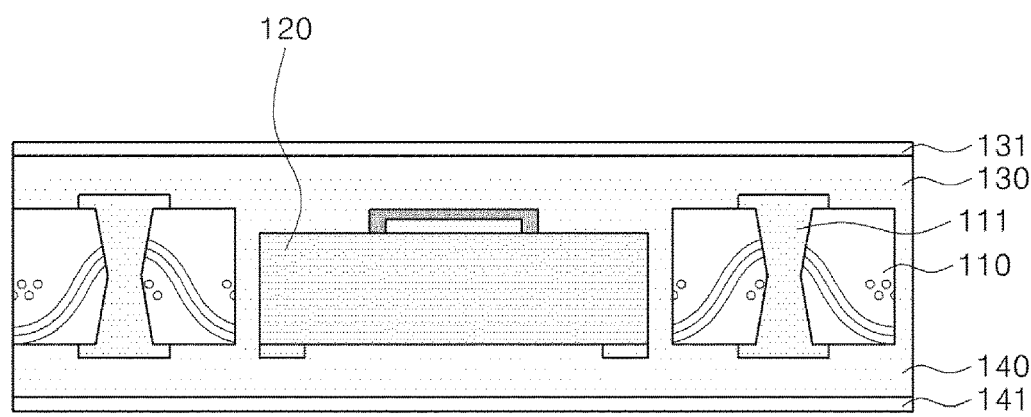

In addition, the support substrate 112 with the adhesive film 113 formed thereon is removed as shown in FIG. 5 and an outer insulating layer 140 is further formed on a surface, from which the support substrate 112 is removed, as shown in FIG. 6.

At this time, a metal layer 141 may be further formed on the outer insulating layer 140.

Figure 7:
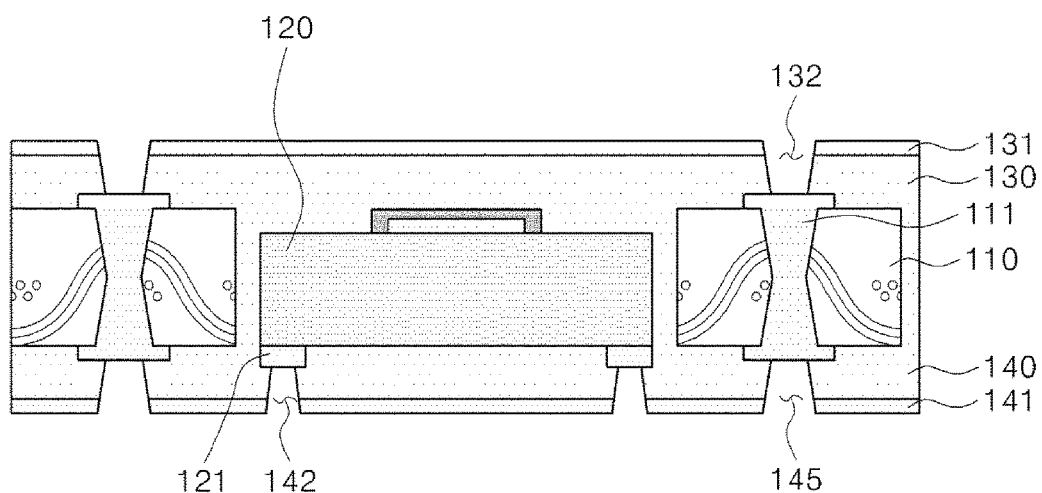

Thereafter, as shown in FIG. 7, a via hole 142 for exposing a terminal 121 of the light emitting element 120 is formed in the outer insulating layer 140.

In addition, via holes 132 and 145 may be further formed in the outer insulating layers 130 and 140 to correspond to the via 111.

Figure 8:
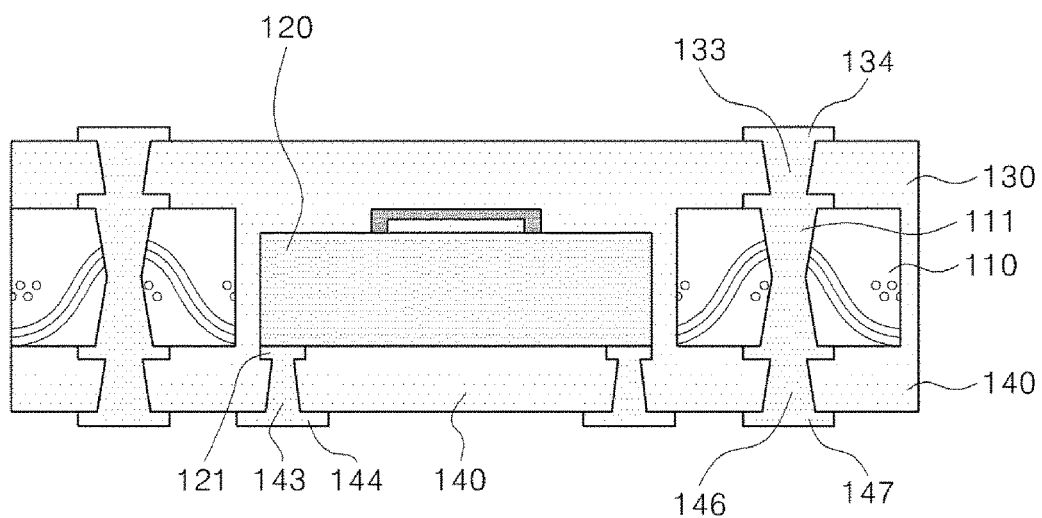

Thereafter, as shown in FIG. 8, the via hole 142 may be filled with a conductive material to form a via 143, thereby forming a circuit pattern 144.

In addition, the via holes 132 and 145 formed in the outer insulating layers 130 and 140 are filled with a conductive material to form vias 133 and 146 and circuit patterns 134 and 147 respectively connected to the vias 133 and 146.

Figure 9:
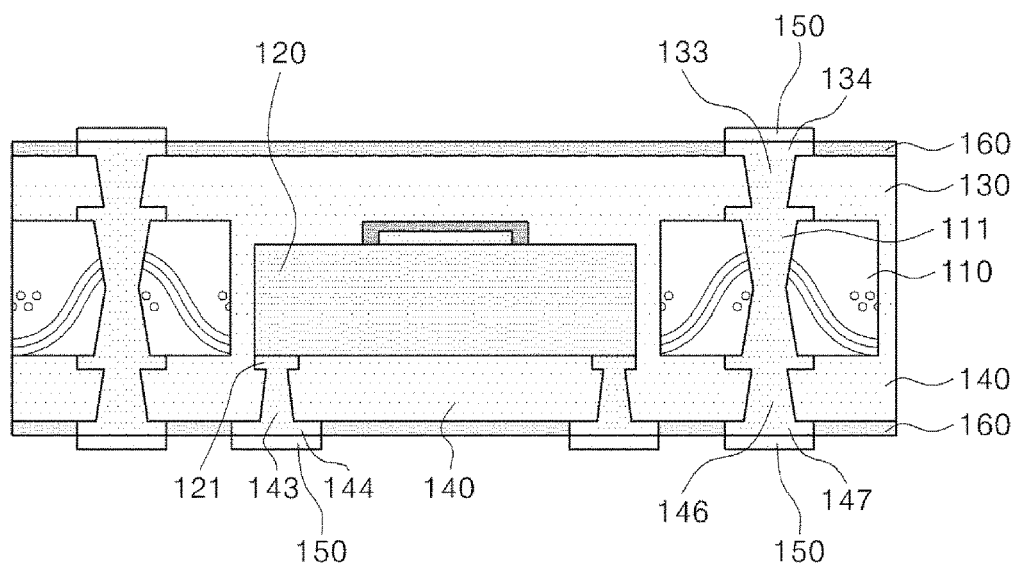

Thereafter, as shown in FIG. 9, protective layers 160 may be formed on the outer insulating layers 130 and 140 and surface treatment layers 150 may be further formed on the circuit patterns 134, 144 and 147.

Figure 10:
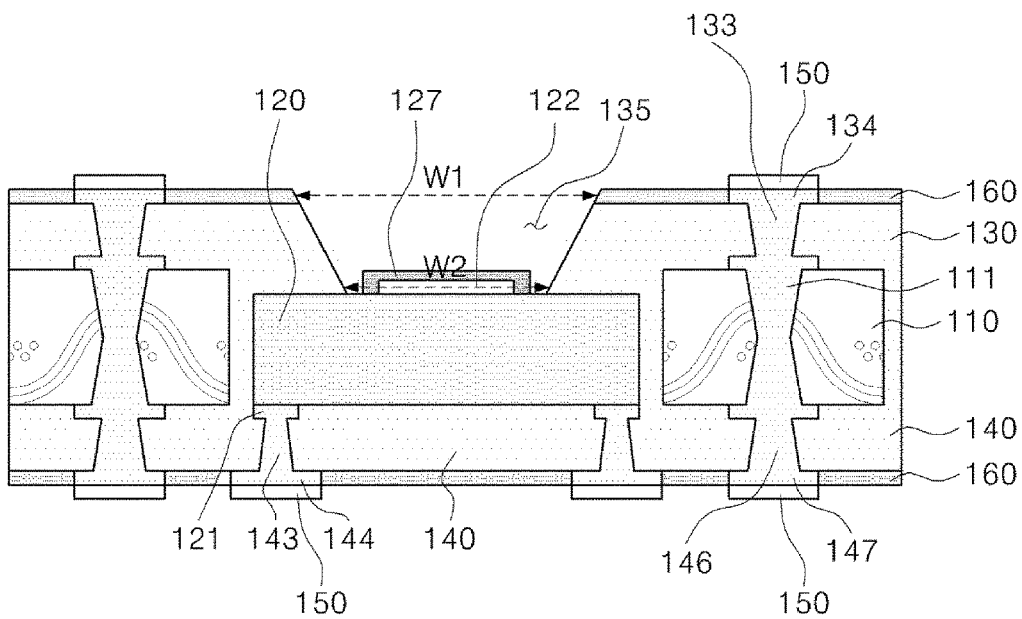
Figure 11:
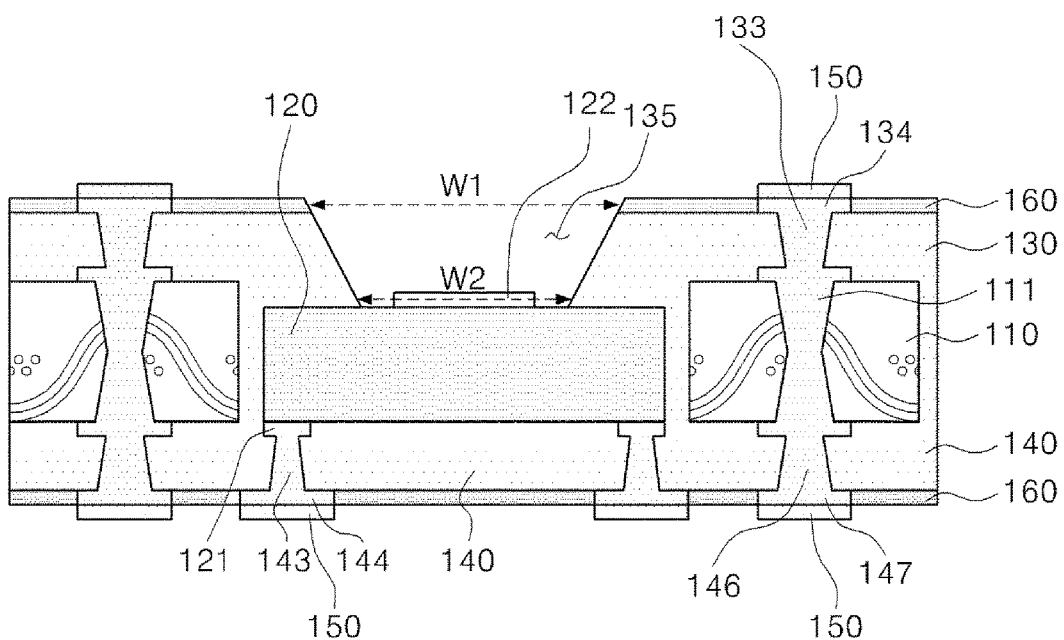

Thereafter, as shown in FIG. 10, an opening 135 is formed in a region corresponding to the light emitting element 120 of the outer insulating layer 130.

More specifically, the opening 135 is formed in a region corresponding to a light emitting unit 122 of the light emitting element 120 of the outer insulating layer 130. At this time, the width W1 of the opening 135 at the side of an exposed surface of the outer insulating layer 130 may be greater than the width W2 of the opening 135 at the side of the light emitting unit 122.

More specifically, a ratio of the width W1 of the opening 135 at the side of an exposed surface of the outer insulating layer 130 to the width W2 of the opening 135 at the side of the light emitting unit 122 is 10:5 to 10:7, in order to more efficiently diffuse light emitted from the light emitting unit 122.

If the ratio of the width W1 of the opening 135 at the side of an exposed surface of the outer insulating layer 130 to the width W2 of the opening 135 at the side of the light emitting unit 122 is less than 10:5 (e.g., 10:4), light emitted from the light emitting unit 122 may be excessively widely diffused. Since the width W1 of the opening 135 at the side of an exposed surface of the outer insulating layer 130 is excessively greater than the width W2 of the opening 135 at the side of the light emitting unit 122, the light emitting element 120 may be easily detached or damaged by external impact.

In addition, if the ratio of the width W1 of the opening 135 at the side of an exposed surface of the outer insulating layer 130 to the width W2 of the opening 135 at the side of the light emitting unit 122 is greater than 10:7 (e.g., 10:8), light is emitted from the light emitting unit 122 in an excessively narrow region, concentrating light in a narrow region, such that the function of the light emitting element 120 is not sufficiently performed.

The opening 135 may be formed in the outer insulating layer 130 using a laser.

In addition, a metal material layer 127 for protecting the light emitting unit 122 is removed upon forming the opening 135 as shown in FIG. 10, such that the light emitting unit 122 is completely exposed through the opening 135.

At this time, the metal material layer 127 may include copper (Cu).

Figure 12:
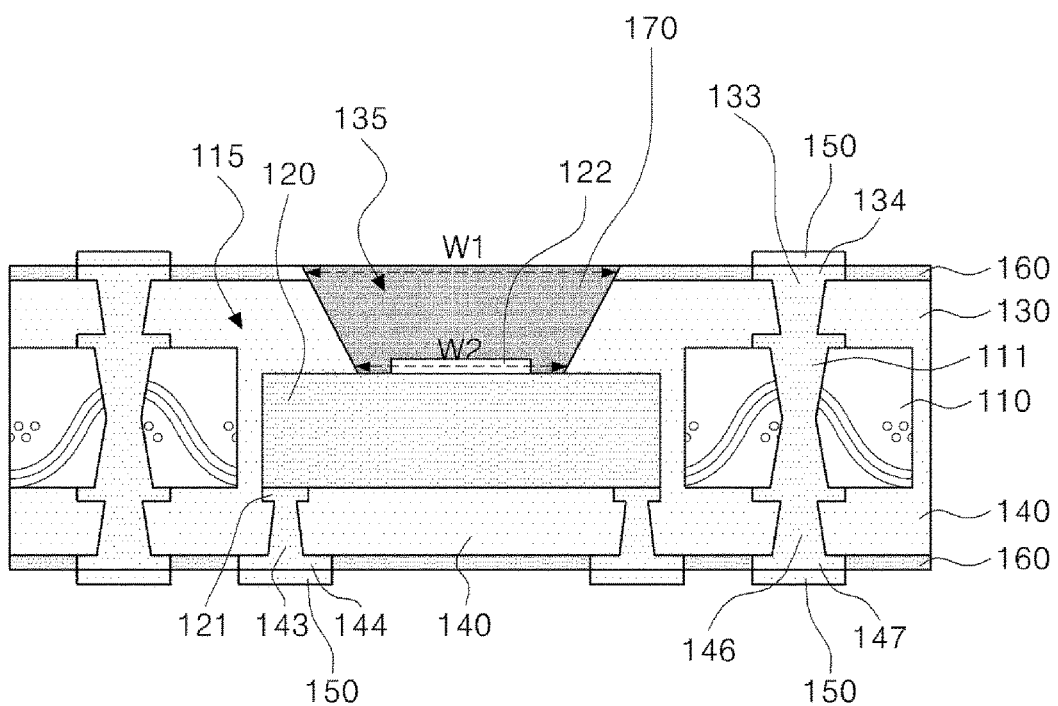

Thereafter, as shown in FIG. 12, the opening 135 of the outer insulating layer 130 is filled with a sealing part 170.

Accordingly, the light emitting unit 122 of the light emitting element 120 is completely embedded by the sealing part 170.

The sealing part 170 is formed of a fluorescent material such that light is more effectively emitted from the light emitting unit 122.

Hereinafter, the configuration of the PCB according to the embodiment of the present invention will be described with reference to FIG. 12.

As shown in FIG. 12, the PCB according to the embodiment of the present invention may further include the insulating layers 110, 130 and 140, the light emitting element 120, the sealing part 170 and the protective layer 160.

The insulating layer 110, 130 and 140 includes the core insulating substrate 110 and the outer insulating layers 130 and 140.

The cavity 115 is formed in the core insulating substrate 110.

In addition, the light emitting element 120 includes the light emitting unit 122 and the light emitting element 120 is provided in the cavity 115.

The outer insulating layer 130 formed at the upper side of the PCB is formed on the core insulating substrate 110. In addition, the opening 135 corresponding to the light emitting unit 122 of the light emitting element 120 is formed in the outer insulating layer 130.

In addition, the sealing part 170 is formed in the opening 135 to fill the opening 135.

According to the embodiment of the present invention, the ratio of the width W1 of the opening 135 or the sealing part 170 at the side of an exposed surface of the outer insulating layer 130 to the width W2 of the opening 135 or the sealing part 170 at the side of the light emitting unit 122 may be 10:5 to 10:7, such that light emitted from the light emitting unit 122 is not concentrated in a narrow regions or is not excessively widely diffused.

More specifically, if the ratio of the width W1 of the opening 135 or the sealing part 170 at the side of an exposed surface of the outer insulating layer 130 to the width W2 of the opening 135 or the sealing part 170 at the side of the light emitting unit 122 is less than 10:5 (e.g., 10:4), light emitted from the light emitting unit 122 may be excessively widely diffused. Since the width W1 of the opening 135 at the side of an exposed surface of the outer insulating layer 130 is excessively greater than the width W2 of the opening 135 at the side of the light emitting unit 122, the light emitting element 120 may be easily detached or damaged by external impact.

In addition, if the ratio of the width W1 of the opening 135 or the sealing part 170 at the side of an exposed surface of the outer insulating layer 130 to the width W2 of the opening 135 or the sealing part 170 at the side of the light emitting unit 122 is greater than 10:7 (e.g., 10:8), light is emitted from the light emitting unit 122 in an excessively narrow region, thereby concentrating light in a narrow region, such that the function of the light emitting element 120 is not sufficiently performed.

According to the embodiment of the present invention, since the light emitting element 120 is embedded in the core insulating substrate 110, the light emitting unit 122 is exposed and the sealing part 170 is formed, an empty space does not occur among the sealing part 170, the core insulating substrate 110 and the light emitting unit 122 to more efficiently emit light from the light emitting unit 122, thereby improving luminous efficacy.

In addition, the sealing part 170 is formed of a fluorescent material to more efficiently diffuse light emitted from the light emitting element 122.

The via 143 is connected to the terminal 121 of the light emitting element 120 and the circuit pattern 144 and heat generated by the light emitting element 120 may be radiated through the via 143.

In addition, the vias 111, 133 and 146 may penetrate through the core insulating substrate 110 and the outer insulating layers 130 and 140 and the vias 133 and 146 may be respectively connected to the circuit patterns 134 and 147.

The protective layers 160 may be formed on the outer insulating layers 130 and 140 and the surface treatment layers 150 may be formed on the circuit patterns 134 and 147.

Figure 13:
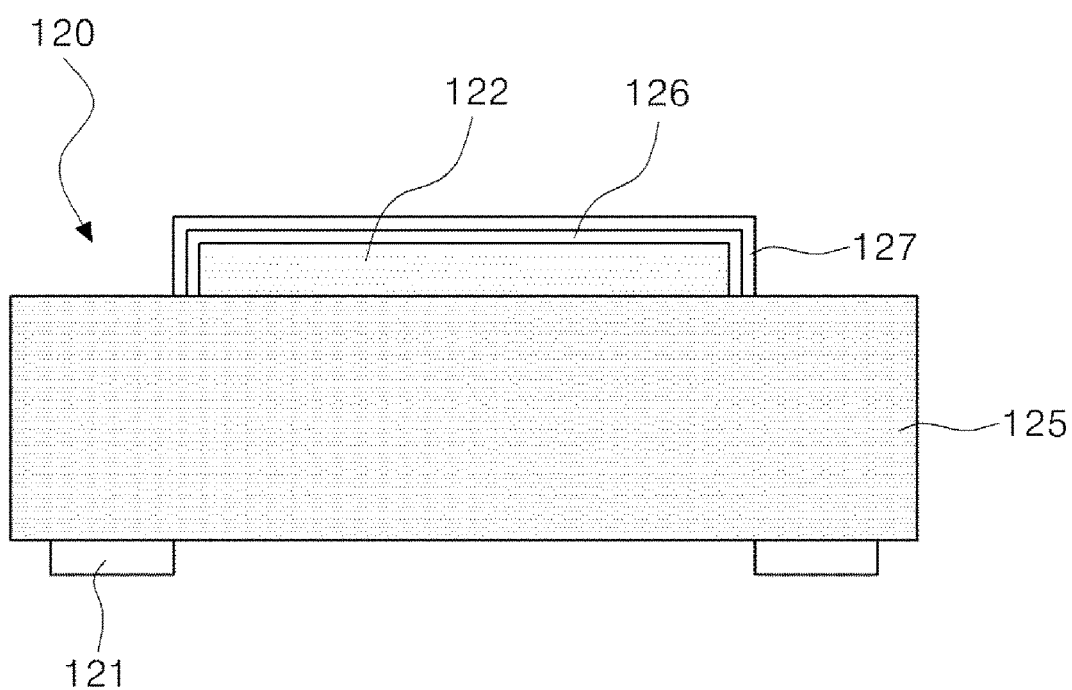
FIG. 13 is a diagram showing a light emitting element according to an embodiment of the present invention.

FIG. 13 is a diagram showing a light emitting element according to an embodiment of the present invention.

The light emitting element according to the embodiment of the present invention will be described with reference to FIG. 13.

As shown in FIG. 13, the light emitting element 120 according to the embodiment of the present invention may include a body 125, a terminal 121 and a light emitting unit 122 and may further include an organic layer 126 for protecting the light emitting unit 122.

At this time, the organic layer 126 is formed on a surface of the light emitting unit 122. The organic layer 126 may be formed of a material with good transmittance suitable for the wavelength of light emitted from the light emitting unit 122, including at least one of polycarbonate, polymethylmethacrylate, cytop, polyvinyl alcohol and polyimide.

In addition, the metal material layer 127 may be formed of copper (Cu). As shown in FIG. 10, the metal material layer 127 protects the light emitting unit 122 in the process of forming the opening 135.

Figure 14:
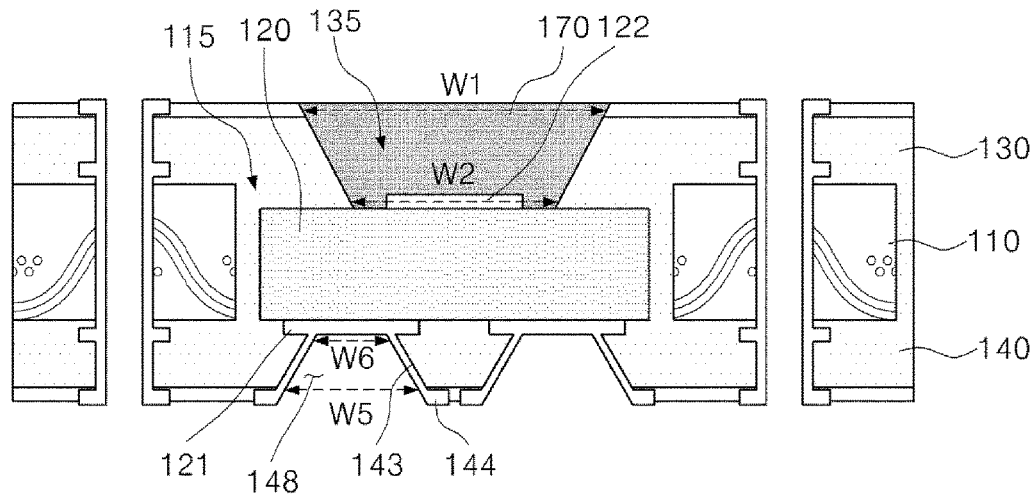
FIGS. 14 and 15 are diagrams showing a printed circuit board according to another embodiment of the present invention.
Figure 15:
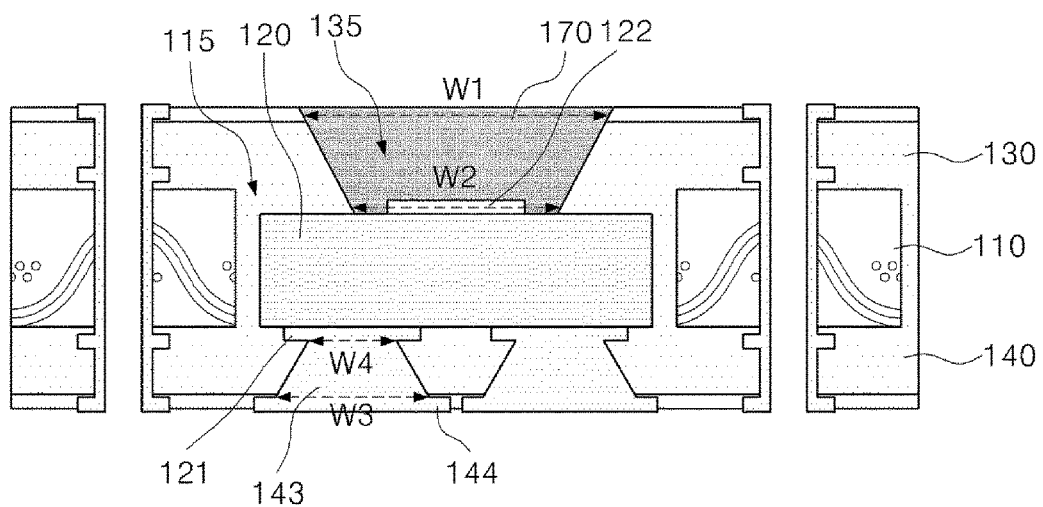

FIGS. 14 and 15 are diagrams showing a PCB according to another embodiment of the present invention.

As shown in FIGS. 14 and 15, the PCB according to the present embodiment may include a core insulating substrate 110, a light emitting element 120, outer insulating layers 130 and 140, a sealing part 170, a via 143 and a circuit pattern 144.

A cavity 115 is formed in the core insulating substrate 110 and the light emitting element 120 is provided in the cavity 115.

The light emitting element 120 includes a light emitting unit 122, an opening 135 corresponding to the light emitting unit 122 of the light emitting element 120 is formed in the outer insulating layer 130, and the sealing part 170 may be formed in the opening 135.

The opening 135 is formed in the outer insulating layer 130 corresponding to the light emitting unit 122 of the light emitting element 120. At this time, the width W1 of the opening 135 at the side of an exposed surface of the outer insulating layer 130 may be greater than the width W2 of the opening 135 at the side of the light emitting unit 122.

At this time, in the embodiment of FIG. 14, the via 143 is connected to the terminal 121 of the light emitting element 120 and the circuit pattern 144 and the width W3 of the via 143 at the side of an exposed surface of the outer insulating layer 140 may be greater than the width W4 of the via 143 at the side of the terminal 121 of the light emitting unit 122.

At this time, the width W3 of the via 143 at the side of an exposed surface of the outer insulating layer 140 may be 1.1 to 1.6 times the width W4 of the via 143 at the side of the terminal 121 of the light emitting unit 122, such that heat generated by the light emitting element 120 is efficiently radiated while maintaining electrical conductivity of the via 143 at a predetermined level or more.

More specifically, if the width W3 of the via 143 at the side of an exposed surface of the outer insulating layer 140 is less than 1.1 times the width W4 of the via 143 at the side of the terminal 121 of the light emitting unit 122, the wall of the via 143 is substantially vertical, such that bubbles are generated upon forming the via 143, deteriorating conductivity.

In addition, if the width W3 of the via 143 at the side of an exposed surface of the outer insulating layer 140 exceeds 1.6 times the width W4 of the via 143 at the side of the terminal 121, the width W3 of the via 143 at the side of an exposed surface of the outer insulating layer is excessively large, such that a plating process is difficult and the via 143 is moved to a wide surface to be connected to a neighboring via or terminal.

In the embodiment of FIG. 15, the via 143 is connected to the terminal 121 of the light emitting element 120 and the circuit pattern 144 and the via 143 may be formed on only the surface of the via hole 142. That is, a conductive material is formed on only the surface of the via hole 142 to form the via 143 and a heat radiation hole 148 which is an empty space is formed in a part of the via hole 142 which is not filled with the conductive material. The heat radiation hole 140 expose the surface of the terminal 121 of the light emitting element 120, thereby easily radiating heat generated by the light emitting element 120 through the heat radiation hole 148.

More specifically, the width W3 of the heat radiation hole 148 at the side of an exposed surface of the outer insulating layer 130 may be 1.1 to 1.6 times the width W4 of the heat radiation hole 148 at the side of the terminal 121, similarly to the via 143 of FIG. 14, such that the terminal 121 of the light emitting element 120 is directly exposed to maximize heat radiation performance.

FIGS. 16 to 24 are diagrams illustrating a PCB and a method of manufacturing the same according to another embodiment of the present invention.

First, the method of manufacturing the PCB according to the embodiment of the present invention will be described with reference to FIGS. 16 to 24.

Figure 16:
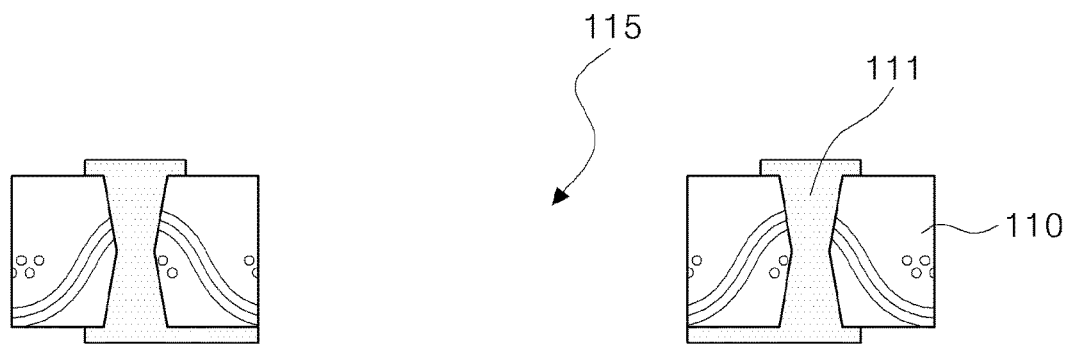
FIGS. 16 to 24 are diagrams illustrating a printed circuit board and a method of manufacturing the same according to another embodiment of the present invention.

As shown in FIG. 16, a cavity 115 is formed in a core insulating substrate 110.

The core insulating substrate 110 is a prepreg including glass fiber and resin and a via 111 formed of a conductive material may be formed in the core insulating substrate 110.

Figure 17:
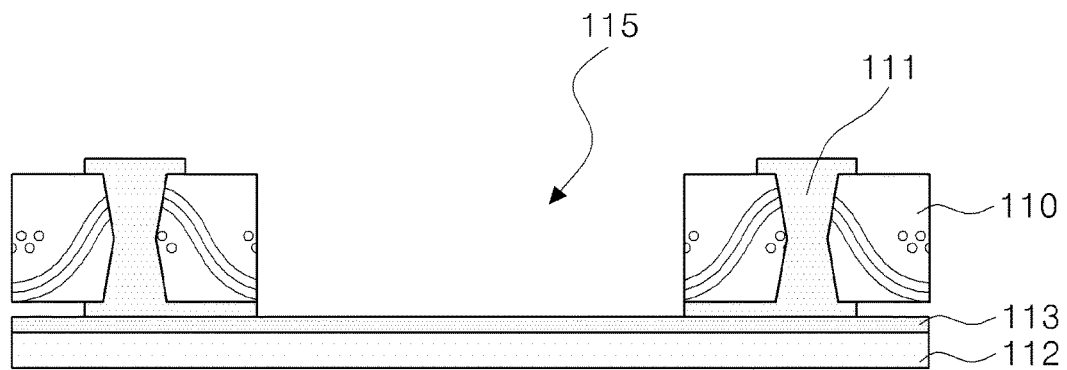
Figure 18:
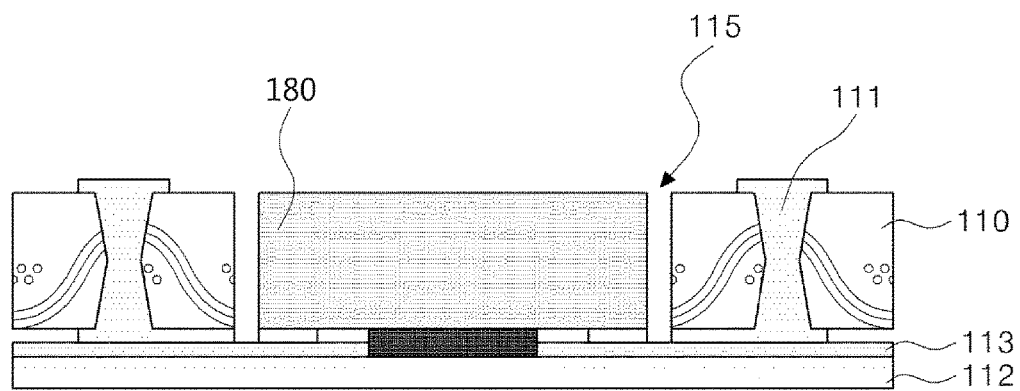

Thereafter, a support substrate 112 is attached to one surface of the core insulating substrate 110 using an adhesive film 113 as shown in FIG. 17 and a sensing element 180 is mounted on the adhesive film 113 in the cavity 115 as shown in FIG. 18.

Figure 19:
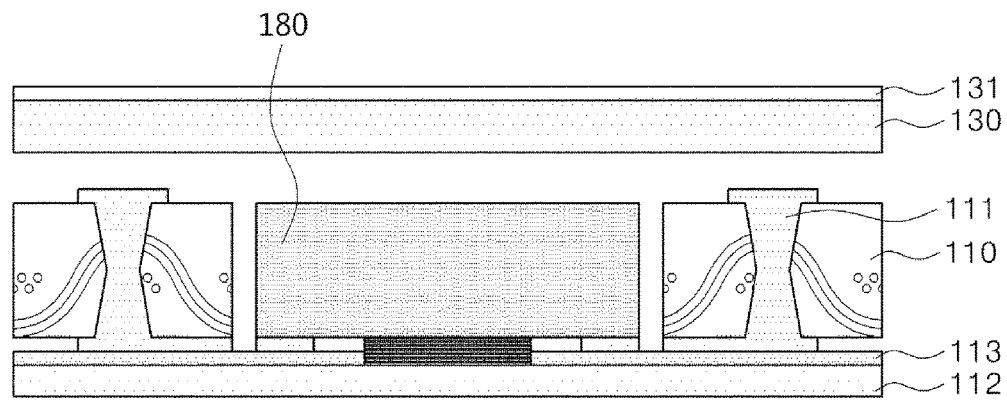

Thereafter, as shown in FIG. 19, an outer insulating layer 130 may be provided on the core insulating substrate 110 and the sensing element 180 and a metal layer 131 may be further formed on the outer insulating layer 130.

Figure 20:
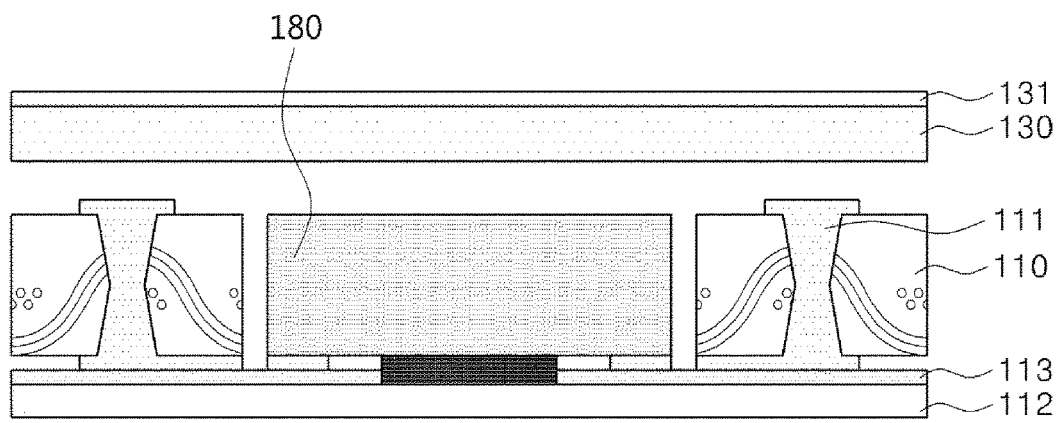

As shown in FIG. 20, a space between the core insulating substrate 110 and the sensing element 180 is filled with a portion of a material forming the outer insulating layer 130 to stably fix the sensing element 180. Thereafter, the adhesive film 113 and the support substrate 112 are removed.

Figure 21:
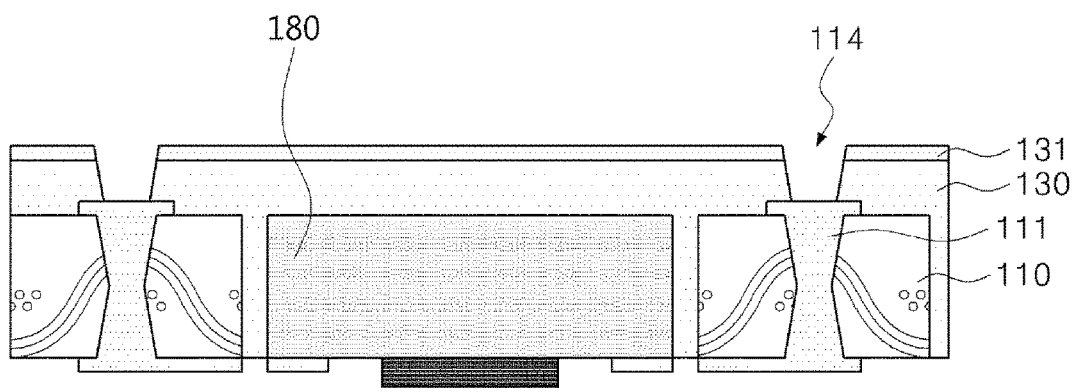
Figure 22:
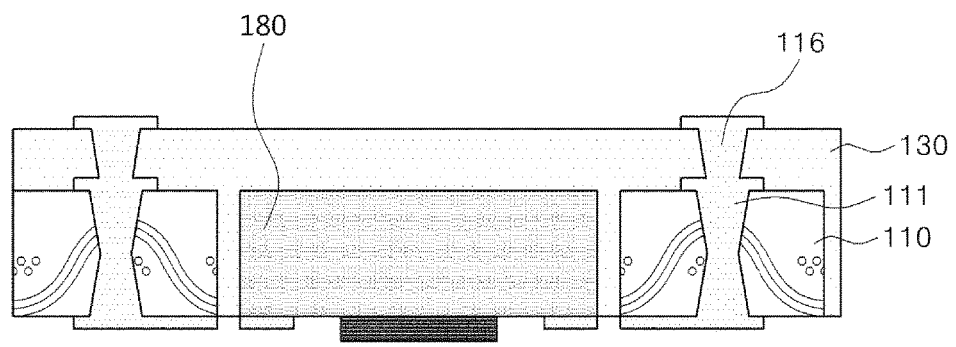

Thereafter, a via hole 114 for exposing the via 111 is formed as shown in FIG. 21 and the via hole 114 is filled with a conductive material to form a via 116.

Figure 23:
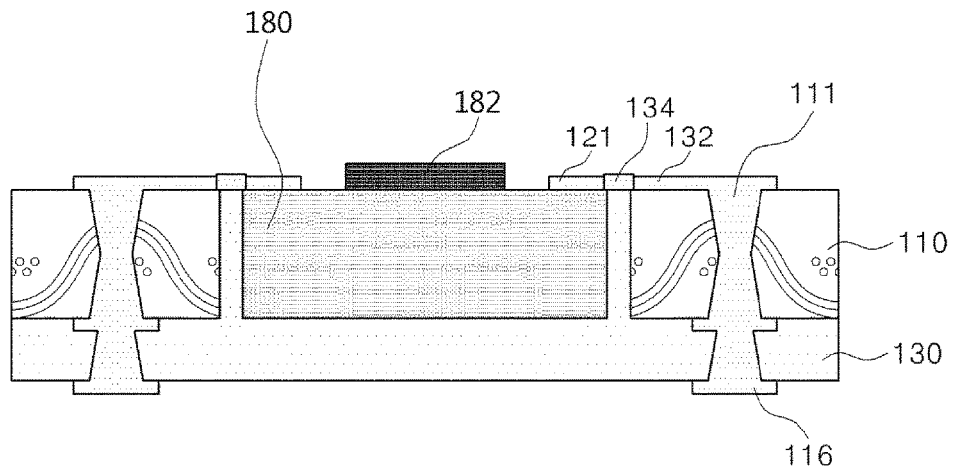

Thereafter, a circuit pattern 134 may be formed to connect the terminal 121 of the sensing element 180 and an external circuit 132 as shown in FIG. 23 and a protective layer 145 may be further formed as shown in FIG. 9.

Hereinafter, the configuration of the PCB according to the embodiment of the present invention will be described with reference to FIG. 24.

Figure 24:
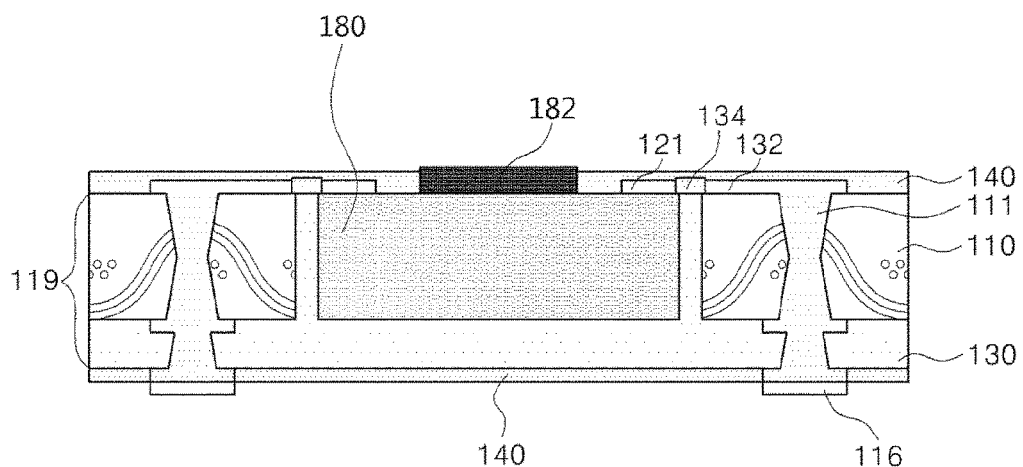

As shown in FIG. 24, the PCB according to the embodiment of the present invention includes an insulating layer 119 and the sensing element 180.

The sensing element 180 according to the embodiment of the present invention refers to an element capable of sensing light, temperature and motion and the sensing element 180 is embedded in the insulating layer 119.

That is, the sensing element 180 is embedded in the insulating layer 119 and is exposed through one surface of the insulating layer 119, and the surface of the sensing element 180, on which a sensing unit 182 is formed, is coplanar with one surface of the insulating layer 119.

At this time, the sensing element 180 may be provided at the side of the exposed surface of the sensing unit 182 of the sensing element 180 off to one side of the center of the insulating layer 119.

More specifically, as shown in FIG. 24, the sensing element 180 may be provided off to one side of the center of the insulating layer 119. At this time, "off to one side" may mean an upper side of the PCB where the sensing unit 182 of the sensing unit 180 is exposed.

The sensing unit 182 of the sensing element 180 may be formed to protrude from the surface of the insulating layer 119.

In the configuration of the insulating layer 119, the insulating layer 119 may include the core insulating substrate 110 and the outer insulating layer 130.

The core insulating substrate 110 may include a single layer and the outer insulating layer 130 may be formed on a surface opposite to the surface of the core insulating substrate 110, through which the sensing unit 182 of the sensing element 180 is exposed.

That is, as shown in FIG. 24, if the sensing element 180 is provided at the upper side of the PCB and the sensing unit 182 of the sensing unit 180 is exposed through the upper side of the PCB, the outer insulating layer 130 may be formed below the PCB.

Accordingly, the sensing element 180 may be provided in the core insulating substrate 110.

In addition, the sensing element 180 may have the same thickness as the core insulating substrate 110.

The surface of the core insulating substrate 110, on which the sensing unit 182 of the sensing element 180 is provided, may be exposed, but the opposite surface thereof may not be exposed since the outer insulating layer 130 is formed thereon.

The core insulating substrate 110 is a prepreg including glass fiber and resin, and the outer insulating layer 130 may be formed of an insulating material.

A first via 111 penetrating through the core insulating substrate 110 may be formed in the core insulating substrate 110 and a second via 116 may be formed in the outer insulating layer 130.

In addition, a circuit pattern 134 is formed in an exposed surface of the core insulating substrate 110. The circuit pattern 134 connects the terminal 121 of the sensing element 180 and the external circuit 132.

A protective layer 145 for protecting the terminal 121 of the sensing element 180, an external circuit 132 and the circuit pattern 134 may be formed on the surface of the PCB.

FIGS. 25 to 32 are diagrams illustrating a printed circuit board and a method of manufacturing the same according to another embodiment of the present invention.

First, the method of manufacturing the PCB according to the embodiment of the present invention will be described with reference to FIGS. 25 to 32.

Figure 25:
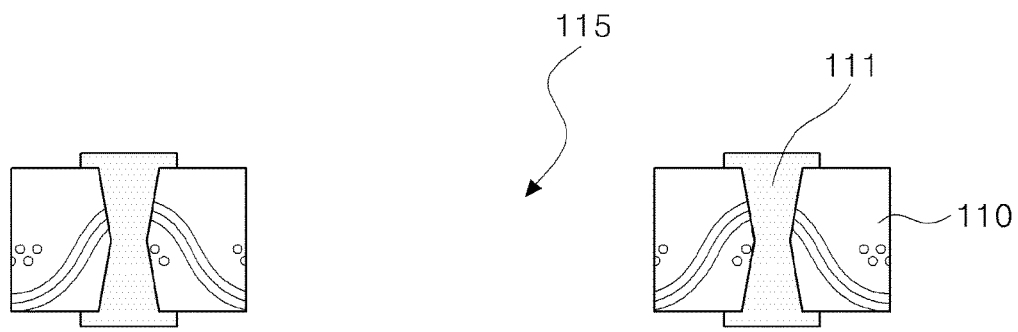
FIGS. 25 to 32 are diagrams illustrating a printed circuit board and a method of manufacturing the same according to another embodiment of the present invention.

As shown in FIG. 25, a cavity 115 is formed in a core insulating substrate 110.

The core insulating substrate 110 may be a prepreg including glass fiber and resin and a via 111 formed of a conductive material may be formed in the core insulating substrate 110.

Figure 26:
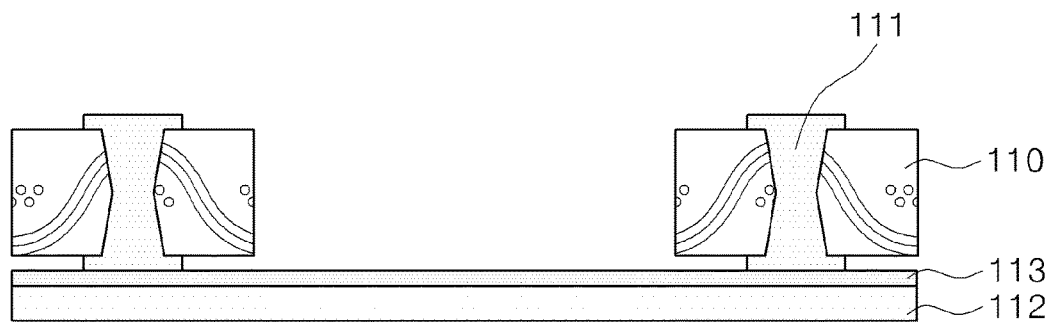
Figure 27:
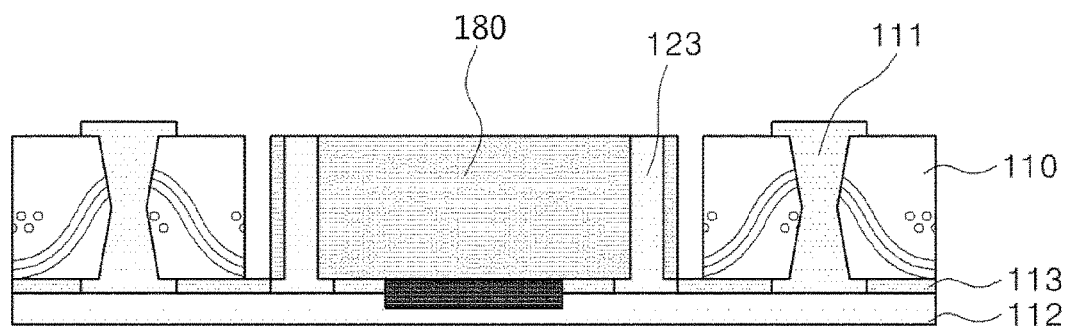

Thereafter, a support substrate 112 is attached to one surface of the core insulating substrate 110 using an adhesive film 113 as shown in FIG. 26 and a sensing element 180 is mounted on the adhesive film 113 in the cavity 115 as shown in FIG. 27.

At this time, a via 123 penetrating through the sensing element 180 may be formed in the sensing element 180.

Figure 28:
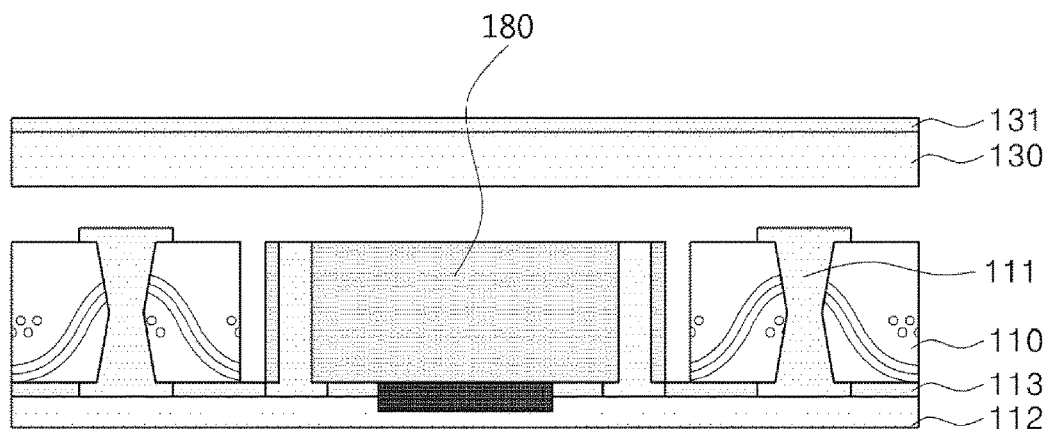

Thereafter, as shown in FIG. 28, an outer insulating layer 130 may be provided on the core insulating substrate 110 and the sensing element 180 and a metal layer 131 may be further formed on the outer insulating layer 130.

Figure 29:
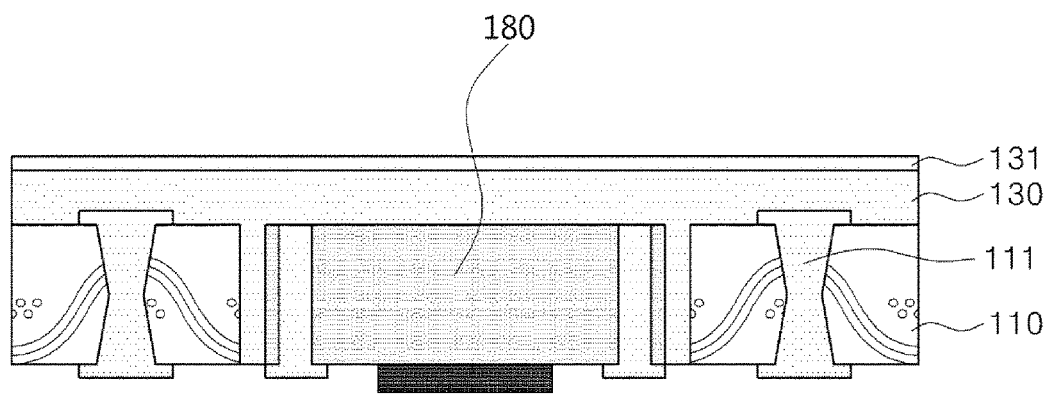

As shown in FIG. 29, a space between the core insulating substrate 110 and the sensing element 180 to stably fix the sensing element 180 is filled with a portion of a material forming the outer insulating layer 130. Thereafter, the adhesive film 113 and the support substrate 112 are removed.

Figure 30:
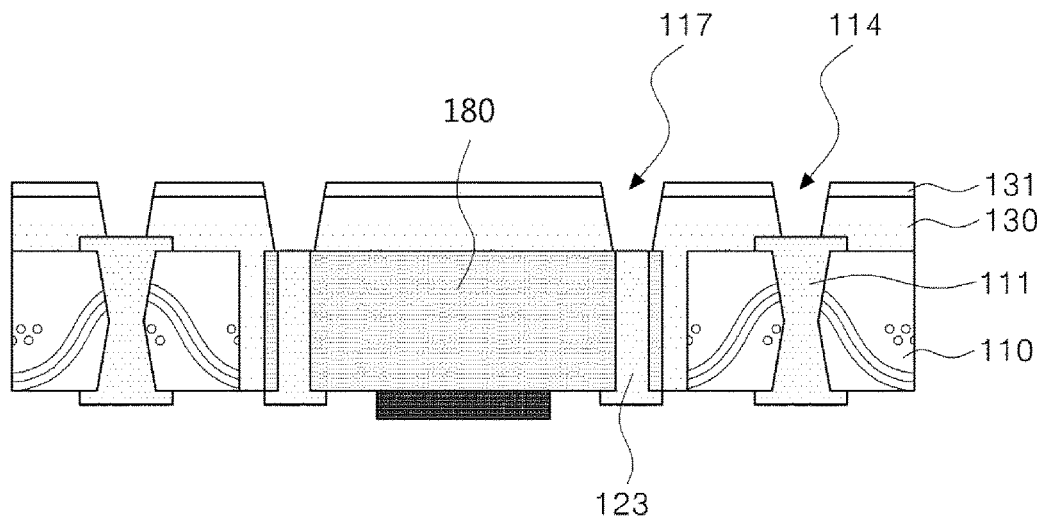

Thereafter, as shown in FIG. 30, a via hole 117 for exposing the via 123 of the sensing element 180 and a via hole 114 for exposing the via 111 are formed as shown in FIG. 30.

Figure 31:
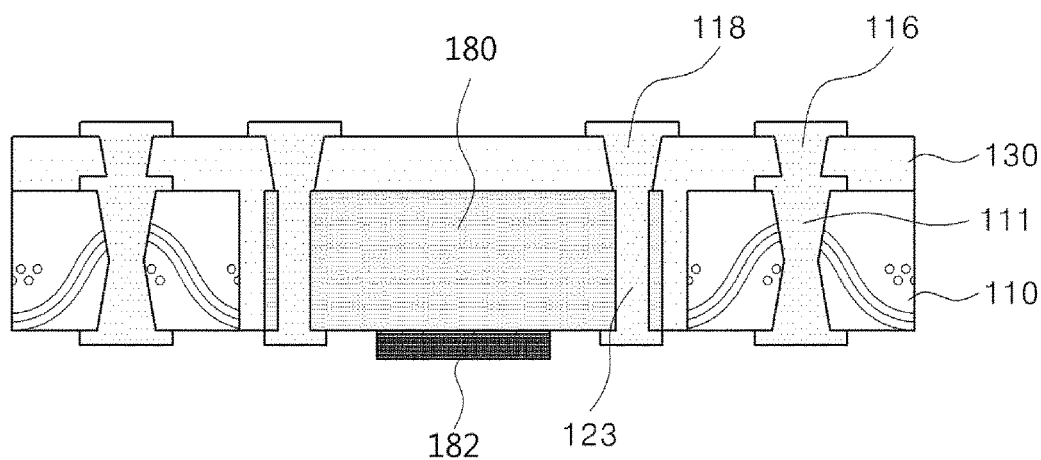

Thereafter, as shown in FIG. 31, the via holes 114 and 117 to form the vias 116 and 118 are filled with a conductive material, thereby being connected to the via 123 penetrating through the sensing element 180.

Figure 32:
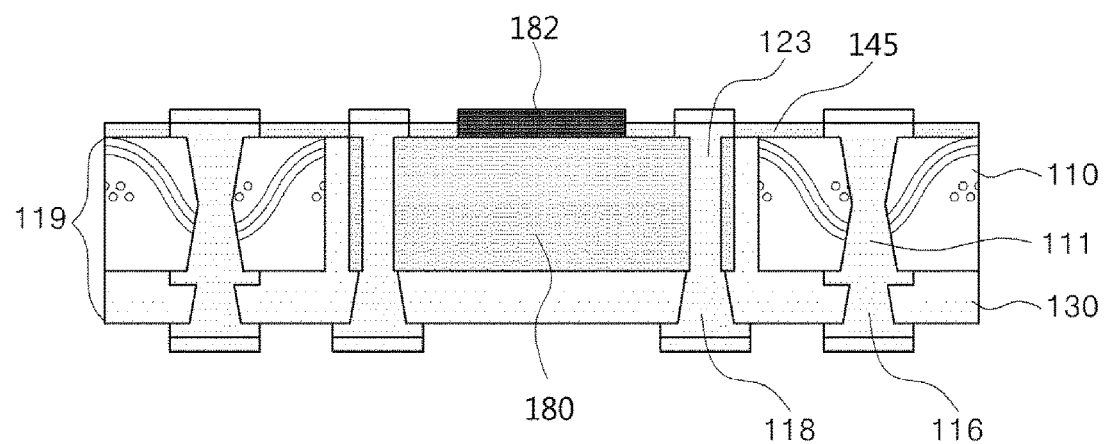

Thereafter, as shown in FIG. 32, a protective layer 145 for protecting the PCB may be further formed on the surface of the PCB.

Hereinafter, the configuration of the PCB according to the embodiment of the present invention will be described with reference to FIG. 32.

As shown in FIG. 32, the PCB according to the embodiment of the present invention includes the insulating layer 119 and the sensing element 180.

The sensing element 180 according to the embodiment of the present invention refers to an element for sensing light, temperature, motion, etc. and the sensing element 180 may be embedded in the insulating layer 119.

That is, the sensing element 180 is embedded in the insulating layer 119 and is exposed through one surface of the insulating layer 119 and the surface of the sensing element 180, on which the sensing unit 182 for performing a sensing function is formed, is coplanar with one surface of the insulating layer 119.

At this time, the sensing element 180 may be provided at the surface of the insulating layer 119, through which the sensing unit 182 of the sensing element 180 is exposed, off to one side of the center of the insulating layer 119. At this time, "off to one side" may mean an upper side of the PCB where the sensing unit 182 of the sensing unit 180 is exposed.

More specifically, as show in FIG. 32, the sensing element 180 may be provided in one side of the insulating layer 119. At this time, the one side of the insulating layer may be an upper side of the insulating layer, through which the sensing unit 182 of the sensing element 180 is exposed.

The sensing unit 182 of the sensing element 180 may be formed to protrude from the surface of the insulating layer 119.

The via 123 penetrating through the sensing element 180 is formed in the sensing element 180.

In the configuration of the insulating layer 180, the insulating layer 119 may include the core insulating substrate 110 and the outer insulating layer 130.

The core insulating substrate 110 may include a single layer and the outer insulating layer 130 may be formed on a surface opposite to the surface of the core insulating substrate 110, through which the sensing unit 182 of the sensing element 180 is exposed.

That is, as shown in FIG. 32, if the sensing element 180 is provided at the upper side of the PCB and the sensing unit 182 of the sensing element 180 is exposed through the upper side of the PCB, the outer insulating layer 130 may be formed below the PCB.

Accordingly, the sensing element 180 may be provided in the core insulating substrate 110.

In addition, the sensing element 180 may have the same thickness as the core insulating substrate 110.

The surface of the core insulating substrate 110, on which the sensing unit 182 of the sensing element 180 is provided, may be exposed, but the opposite surface thereof may not be exposed since the outer insulating layer 130 is formed thereon.

The core insulating substrate 110 may be a prepreg including glass fiber and resin and the outer insulating layer 130 may be formed of an insulating material.

The via 111 penetrating through the core insulating substrate 110 may be formed in the core insulating substrate 110 and the via 116 may be formed in the outer insulating layer 130.

In addition, the outer insulating layer 130 may further include the via 118 connected to the via 123 penetrating through the outer insulating layer 130 and the sensing element 180.

The protective layer 145 for protecting the via 123 of the sensing element 180, an external circuit 132 and the circuit pattern 134 may be formed on the surface of the PCB.

As described above, according to the embodiment of the present invention, the sensing element 180 is embedded in the insulating layer 119 and is exposed through one surface of the insulating layer 119 such that the exposed surface of the sensing element 180 is coplanar with the surface of the insulating layer 119. A separate process of exposing the sensing unit 182 of the sensing element 180 is not necessary and manufacturing costs may be reduced.

Although the preferred embodiments have been disclosed, the embodiments are purely exemplary and do not limit the present disclosure. Those skilled in the art will appreciate that various modifications and applications are possible, without departing from the embodiments. The technical spirit of the present invention is not limited to the above-described embodiments and should be determined by the appended claims and their legal equivalents.

The invention claimed is:
1. A printed circuit board (PCB) comprising:
an insulating layer,
and a sensing element embedded in the insulating layer and having a sensing unit exposed through one surface of the insulating layer,
a surface of the sensing element, through which the sensing unit is exposed, being coplanar with a surface of the insulating layer,
wherein the insulating layer includes: a core insulating substrate including a single layer,
and an outer insulating layer formed on a surface opposite to a surface of the core insulating substrate, through which the sensing unit is exposed,
a first via penetrating through the sensing element,
a second via formed in the outer insulating layer and connected to the first via,
an external circuit pattern formed on an exposed surface of the core insulating substrate to connect a terminal of the sensing element and an external circuit;
and a protective layer for protecting the terminal of the sensing element and the external circuit pattern,
wherein the sensing unit protrudes from a surface of the protective layer,
and wherein a thickness of the protective layer is thinner than a thickness of the sensing unit.
2. The PCB according to claim 1, wherein the sensing element is provided at a side of a surface, through which the sensing unit is exposed, off to one side of the center of the insulating layer.
3. The PCB according to claim 1, wherein the sensing element is provided in the core insulating substrate.
4. The PCB according to claim 1, wherein a surface, on which the sensing unit is provided, of the core insulating substrate is exposed.
5. The PCB according to claim 1, wherein the sensing element has the same thickness as the core insulating substrate.
6. The PCB according to claim 1, wherein the sensing unit protrudes from a surface of the single layer.

7. The PCB according to claim 1, wherein the protective layer has an opening section for exposing the sensing unit of the sensing element.

* * * * *